(12) United States Patent
Shimizu et al.

(10) Patent No.: US 9,188,633 B2
(45) Date of Patent: Nov. 17, 2015

(54) POWER SUPPLY APPARATUS FOR TEST APPARATUS

(75) Inventors: Takahiko Shimizu, Tokyo (JP); Katsuhiko Degawa, Tokyo (JP)

(73) Assignee: ADVANTEST CORPORATION (JP)

( * ) Notice: Subject to any disclaimer, the term of this patent is extended or adjusted under 35 U.S.C. 154(b) by 907 days.

(21) Appl. No.: 13/402,502

(22) Filed: Feb. 22, 2012

(65) Prior Publication Data

US 2012/0218004 A1      Aug. 30, 2012

(30) Foreign Application Priority Data

Feb. 24, 2011   (JP) ................................. 2011-038179

(51) Int. Cl.
  G01R 31/28      (2006.01)
  G01R 31/30      (2006.01)
  G01R 31/3173    (2006.01)
  G01R 31/317     (2006.01)

(52) U.S. Cl.
  CPC ............ *G01R 31/2839* (2013.01); *G01R 31/30* (2013.01); *G01R 31/3173* (2013.01); *G01R 31/31721* (2013.01)

(58) Field of Classification Search
  CPC ..................... G01R 31/31721; G01R 31/3173; G01R 31/30; G01R 31/3004
  See application file for complete search history.

(56) References Cited

U.S. PATENT DOCUMENTS

| 4,626,769 | A | 12/1986 | Valley et al. |
|---|---|---|---|
| 7,684,462 | B2 | 3/2010 | Ye et al. |
| 8,391,332 | B2 | 3/2013 | Ye et al. |
| 2002/0043987 | A1* | 4/2002 | Takeuchi ........................ 324/765 |
| 2004/0189272 | A1* | 9/2004 | Matsuura et al. ............. 323/283 |
| 2006/0116843 | A1* | 6/2006 | Kodera ........................ 702/124 |
| 2006/0221646 | A1 | 10/2006 | Ye et al. |

(Continued)

FOREIGN PATENT DOCUMENTS

| CN | 1553562 | 12/2004 |
|---|---|---|
| CN | 100413191 | 8/2008 |

(Continued)

OTHER PUBLICATIONS

Office Action dated Dec. 23, 2013 for the corresponding Chinese Patent Application No. 201210044676.1, and its English summary provided by the clients.

(Continued)

*Primary Examiner* — Huy Q Phan
*Assistant Examiner* — Adam Clarke
(74) *Attorney, Agent, or Firm* — Cantor Colburn LLP (57) ABSTRACT

A first A/D converter converts an analog observed value, which corresponds to a power supply signal supplied to a power supply terminal of a DUT, into a digital observed value. By means of digital calculation processing, a digital signal processing circuit generates a control value that is adjusted such that the digital observed value matches a predetermined reference value. A first D/A converter supplies, via a power supply line to the power supply terminal of the DUT, an analog power supply signal obtained by performing digital/analog conversion of the control value. A load estimating unit applies a test signal containing a predetermined frequency component via the power supply line to a node via which the power supply terminal is to be connected, and generates a control parameter for the digital signal processing circuit according to the test signal and the observed signal.

19 Claims, 5 Drawing Sheets

(56) References Cited

U.S. PATENT DOCUMENTS

2006/0244433 A1* 11/2006 Nakahara .................... 324/76.11
2009/0289609 A1* 11/2009 Hashimoto ................... 323/282
2010/0165675 A1    7/2010 Ye et al.
2010/0289683 A1* 11/2010 Kito ............................. 341/144

FOREIGN PATENT DOCUMENTS

| CN | 100454731 | 1/2009 |
| JP | 56-36701 | 4/1981 |
| JP | 62-502773 | 10/1987 |
| JP | 01-301187 | 12/1989 |
| JP | 09-178820 | 7/1997 |
| JP | 2002-040090 | 2/2002 |
| JP | 2004-529400 | 9/2004 |
| JP | 2006-023142 | 1/2006 |
| JP | 2007-064900 | 3/2007 |
| JP | 2009-072004 | 4/2009 |
| WO | 86/05604 | 9/1986 |
| WO | 02/31951 | 4/2002 |

OTHER PUBLICATIONS

Office Action dated Dec. 27, 2013 for the corresponding Taiwanese Patent Application No. 101104624, and its English summary provided by the clients.

Office Action dated Jan. 21, 2014 for the corresponding Japanese Patent Application No. 2011-038179, and its English summary provided by the clients.

Office Action dated Jan. 27, 2014 for the corresponding Korean Patent Application No. 10-2012-0016077, and its English summary provided by the clients.

Office action dated Sep. 24, 2013 from corresponding Japanese Patent Application No. 2011-038179 and its English summary provided by the clients and through ABBYY PDF Transformer / Google Translate.

Office action dated Jul. 4, 2013 from corresponding Korean Patent Application No. 10-2012-0016077 and its English summary provided by the client.

* cited by examiner

POWER SUPPLY APPARATUS FOR TEST APPARATUS

CROSS-REFERENCE TO RELATED APPLICATIONS

This application claims to priority to Japanese Patent Application No. 2011-038179 filed on Feb. 24, 2011 the disclosure of which is incorporated herein by reference in its entirety.

BACKGROUND OF THE INVENTION

1. Field of the Invention

The present invention relates to a power supply apparatus configured to supply a power supply voltage or otherwise a power supply current to a device under test.

2. Description of the Related Art

Figure 1:
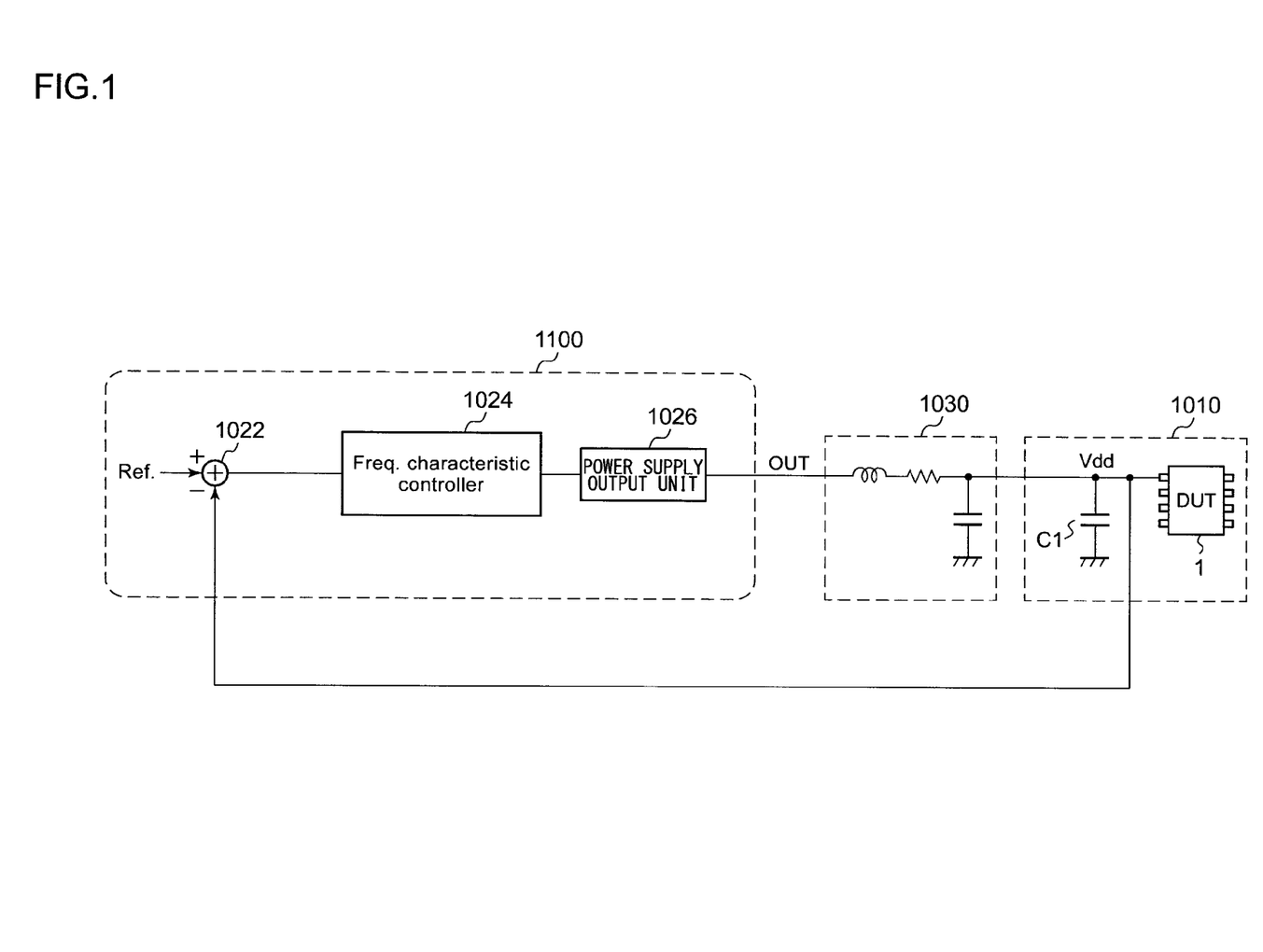
FIG. 1 is a block diagram which shows a schematic configuration of a conventional power supply apparatus.

A test apparatus includes a power supply apparatus configured to supply a power supply voltage or power supply current (which will be referred to as the "power supply voltage Vdd" hereafter) to a device under test (DUT). FIG. 1 is a block diagram which shows a schematic configuration of a conventional power supply apparatus. A power supply apparatus 1100 includes a power supply output unit 1026 and a frequency controller (which will be referred to as the "controller" hereafter) 1024 configured to control the power supply output unit 1026. For example, the power supply output unit 1026 is configured as an operational amplifier (buffer), a DC/DC converter, a linear regulator, or a constant current source, and is configured to generate a power supply voltage or a power supply current (output signal OUT) to be supplied to the DUT 1.

A decoupling capacitor C1 is arranged in the vicinity of the power supply terminal of the DUT 1. Furthermore, the output terminal of the power supply apparatus 1100 and the power supply terminal of the DUT 1 are connected via a cable. With such an arrangement, the target to be controlled by the power supply apparatus 1100 is not the output signal OUT of the power supply output unit 1026, but in actuality is the power supply voltage Vdd applied to the power supply terminal of the DUT 1. With conventional techniques, the controller 1024 outputs a control value such that the difference between the observed value (control target) that is fed back and a predetermined reference value (standard value) becomes zero. Examples of the observed values include a feedback signal that corresponds to the power supply voltage or the power supply current supplied to the DUT 1. For example, a circuit element 1022 indicated by the subtractor symbol in FIG. 1 is configured as an error amplifier (operational amplifier), and is configured to amplify the difference between the observed value and the reference value. The analog controller 1024 generates a control value such that the difference becomes zero. The state of the power supply output unit 1026 is feedback controlled according to the control value thus generated. As a result, the power supply voltage Vdd to be controlled is stabilized to the target value. The parameters that are to be considered when the control target 1010 is controlled are represented by a parasitic parameter 1030, which is symbolic parameter. The parasitic parameter 1030 includes a parasitic resistance, a parasitic capacitance, a parasitic inductance, and so forth, of the power supply cable and each of the internal components of the power supply apparatus 1100.

With conventional techniques, the controller 1024 is configured employing an analog circuit. Accordingly, the overall performance of the controller 1024 is fixedly determined by the performance of the analog elements that form the analog circuit, which is a problem. That is to say, with a power supply apparatus 1100 designed assuming that the control target 1010 and the parasitic parameter 1030 are both fixed, if either the control target 1010 or the parasitic parameter 1030 differ from what is assumed in the design, such a power supply apparatus 1100 cannot exhibit its design performance.

Furthermore, with conventional techniques, the control target 1010 and the parasitic parameter 1030 are approximated using a well-fitting equivalent circuit. However, such an approximation cannot be expected to provide high precision. In order to solve such a problem, with conventional techniques, in order to provide stabilized circuit operation, there is a need to design the controller 1024 such that it has a narrow feedback bandwidth, which has the undesirable effect of degrading the circuit properties.

SUMMARY OF THE INVENTION

The present invention has been made in order to solve such a problem. Accordingly, it is an exemplary purpose of the present invention to provide a power supply apparatus which is capable of providing an optimum control operation according to the load and the parasitic impedance.

An embodiment of the present invention relates to a power supply apparatus for a test apparatus, configured to supply a power supply signal to a power supply terminal of a device under test via a power supply line. The power supply apparatus comprises: a first A/D converter configured to receive, via a feedback line, an analog observed value that corresponds to the power supply signal supplied to the power supply terminal of the device under test, and to perform analog/digital conversion of the analog observed value thus received so as to generate a digital observed value; a digital signal processing circuit configured to generate, by means of digital calculation processing, a control value that is adjusted such that the digital observed value received from the first A/D converter matches a predetermined reference value; a D/A converter configured to perform digital/analog conversion of the control value so as to generate an analog power supply signal and to supply the analog power supply signal to the power supply terminal of the device under test via the power supply line; and a load estimating unit configured to generate a test signal containing a predetermined frequency component, to apply the test signal via the power supply line to a node to which the power supply terminal of the device under test is to be connected, to receive, via the feedback line, an observed signal that occurs at the node due to the application of the test signal, and to generate a control parameter for the digital signal processing circuit according to the test signal and the observed signal.

The test signal is returned as an observed signal via a parasitic impedance that occurs due to a bypass capacitor arranged as a peripheral component for the device under test, a socket (performance board) on which the device under test is to be mounted, and so forth. That is to say, the parasitic impedance characteristics can be measured based upon the relation between the observed signal and the test signal. By adjusting, based upon the impedance characteristics thus measured, the control parameter for the signal processing operation of the digital signal processing circuit, such an arrangement provides an optimum control operation that corresponds to the parasitic impedance.

Also, a power supply apparatus according to an embodiment may further comprise a first selector arranged such that its output terminal is connected to the power supply line, the power supply signal is received via its first input terminal from the D/A converter, and the test signal is input via its second input terminal.

Also, the load estimating unit may comprise: a signal generator configured to generate the test signal; a second A/D converter configured to convert the observed signal into a digital observed value; and a calculation unit configured to generate the control parameter based upon an output value of the second A/D converter and a digital value that corresponds to the test signal.

Also, a power supply apparatus according to an embodiment may further comprise a second selector arranged such that its input terminal is connected to the feedback line, its first output terminal is connected to an input terminal of the first A/D converter, and its second output terminal is connected to an input terminal of the second A/D converter.

Also, the load estimating unit may be configured to calculate a transfer function for a path comprising the power supply line and the feedback line based upon the test signal and the observed signal, and to generate the control parameter according to the transfer function.

Also, the test signal may be configured as any one of a pseudo-random binary signal (Pseudo Random Binary Sequence), a pulse signal, and a frequency sweep signal.

Also, a power supply apparatus according to an embodiment may further comprise a signal superimposing unit configured to superimpose on the reference value a signal that corresponds to the transfer function acquired by the load estimating unit.

Also, a power supply apparatus according to an embodiment may further comprise a signal superimposing unit configured to superimpose a signal that corresponds to the transfer function acquired by the load estimating unit on a value of the difference between the digital observed value and the reference value.

Also, a power supply apparatus according to an embodiment may further comprise a signal superimposing unit configured to superimpose on the control value a signal that corresponds to the transfer function acquired by the load estimating unit.

Another embodiment of the present invention also relates to a power supply apparatus. The power supply apparatus comprises: a power supply unit configured to receive, via a feedback line, an observed value that corresponds to the power supply signal supplied to the power supply terminal of the device under test, and to generate a power supply signal that is adjusted such that the observed value matches a predetermined reference value; and a load estimating unit configured to apply a test signal containing a predetermined frequency component via a power supply line to a node via which a power supply terminal of the device under test is to be connected, to receive, via the feedback line, an observed signal that occurs at the node due to the application of the test signal, and to set a signal processing operation of the power supply unit according to the test signal and the observed signal.

Such an embodiment allows an optimum control operation to be performed according to the parasitic impedance.

Yet another embodiment of the present invention relates to a test apparatus. The test apparatus comprises a power supply apparatus according to any one of the aforementioned embodiments, configured to supply electric power to a device under test.

Such an embodiment is capable of judging the quality of, or identifying defective parts of, the device under test while suppressing effects of the power supply.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

Figure 2:
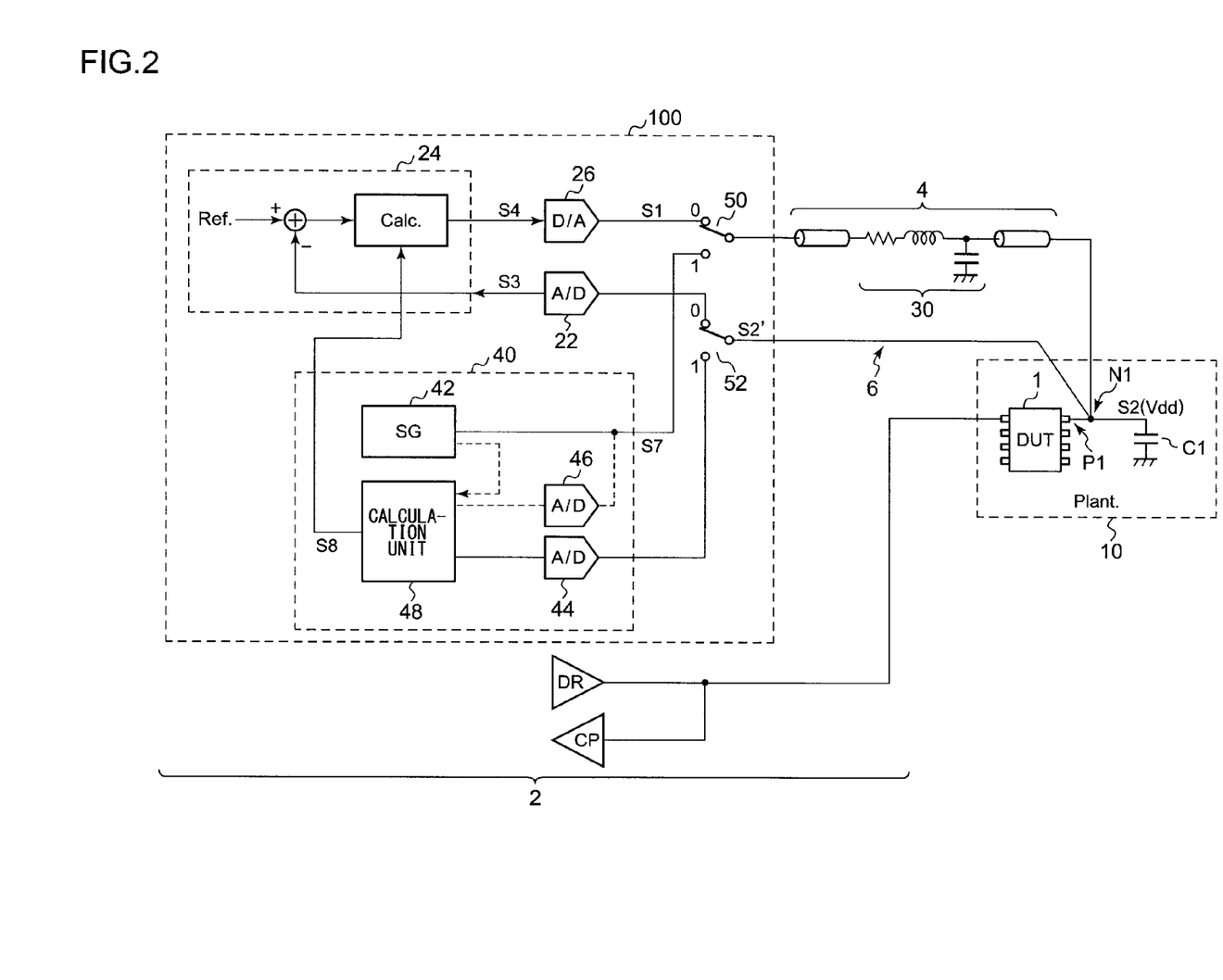
FIG. 2 is a block diagram which shows a test apparatus including a power supply apparatus according to an embodiment.

FIG. 2 is a block diagram which shows a test apparatus 2 including a power supply apparatus 100 according to an embodiment. The test apparatus 2 is configured to supply a signal to a DUT 1, and to compare a signal received from the DUT 1 with an expected value so as to judge the quality of the DUT 1 or to identify defective parts of the DUT 1.

The test apparatus 2 includes a driver DR, a comparator (timing comparator) CP, a power supply apparatus 100, and so forth. The driver DR is configured to output a test pattern signal to the DUT 1. The test pattern signal is generated by an unshown timing generator TG, pattern generator PG, waveform shaper FC (Format Controller), and so forth (none of which is shown in the drawing), and is input to the driver DR. The signal output from the DUT 1 is input to the comparator CP. The comparator CP compares the signal received from the DUT 1 with a threshold value, and latches the comparison result at an appropriate timing. The output of the comparator CP is compared with its expected value. The above is the schematic configuration of the test apparatus 2.

The power supply apparatus 100 generates a power supply voltage Vdd or a power supply current (which will also be referred to as the "power supply signal S1" hereafter) for the DUT 1, and supplies the power supply signal S1 thus generated to a power supply terminal P1 of the DUT 1 via a power supply cable (power supply line) 4 or the like. The power supply signal supplied to the power supply terminal P1 of the DUT 1 is represented by S2, which is distinguished from S1.

A parasitic parameter 30 is a symbolic parameter which collectively represents the parameters to be taken into account in the control operation for the control target 10 in the same way as described with reference to FIG. 1. That is to say, the parasitic parameter 30 is not an explicit element that actually exits in the circuit, but is regarded as being an impedance component that occurs at the power supply line 4 or at a connector (not shown).

The test apparatus 2 tests the DUT 1 while dynamically switching the state of the DUT 1. Accordingly, the current consumption of the DUT 1, i.e., the load of the power supply apparatus 100, changes dynamically. With the present embodiment, the power supply signal S1 functions as the power supply voltage Vdd.

A typical power supply apparatus has a problem in that, if the load changes suddenly, the feedback control operation for the power supply signal does not follow the sudden change in the load, leading to the output signal deviating from the target value. With the test apparatus 2, the fluctuation in the output signal of the power supply apparatus has an effect on the signal output from the DUT 1. That is to say, this leads to a problem in that the abnormal state (Fail) judged by the comparator CP cannot be judged with respect to whether it is due to the DUT 1 itself or due to the power supply apparatus.

In particular, the degree of fluctuation in the load of the DUT 1 in the test operation is greater than that in a state in which the DUT 1 is mounted on a set (electronic device) after shipment. In such circumstances, the power supply apparatus 100 mounted on the test apparatus 2 is strictly required to be highly responsive to the fluctuation in the load. Description will be made below regarding a configuration of the power supply apparatus 100 which can be suitably employed in the test apparatus 2.

The power supply apparatus 100 includes a first A/D converter 22, a digital signal processing circuit 24, a first D/A converter 26, a load estimating unit 40, a first selector 50, and a second selector 52.

The first A/D converter 22 receives, via a feedback line 6, an analog observed value S2' that corresponds to the power supply signal S2 supplied to the power supply terminal P1 of the DUT 1, and performs analog/digital conversion of the analog observed value S2' thus received so as to generate a digital observed value S3. The analog observed value S2' may be the power supply voltage Vdd supplied to the DUT 1 without change, or it may be a voltage stepped down by dividing the power supply voltage Vdd.

The digital signal processing circuit 24 generates a digital control value S4 by digital processing. The digital control value S4 is adjusted such that the digital observed value S3 received from the first A/D converter 22 matches a predetermined reference value Ref. For example, the digital signal processing circuit 24 may be configured as a CPU (Central Processing Unit), a DSP (Digital Signal Processor), an FPGA (Field Programmable Gate Array), or the like.

The digital signal processing circuit 24 is configured to be capable of changing the content of the signal processing, i.e., the control characteristics. For example, based on the difference between the digital observed value S3 and the reference value Ref, the digital signal processing circuit 24 may perform a PID (proportional, integral, differential) control operation. With such an arrangement, in the operation for changing the content of the signal processing, various kinds of parameters (e.g., gain, filter order or cutoff frequency) used in the PID control operation may be changed. Also, an operational expression may be modified. Alternatively, the digital signal processing circuit 24 may perform any one of a P control operation, PI control operation, and a PD control operation, instead of the PID control operation.

Also, the digital signal processing circuit 24 may switch the control operation itself between the PID control operation, P control operation, PI control operation, PD control operation, and so forth, when the content of the signal processing is changed.

The first D/A converter 26 is configured to perform digital/analog conversion of the digital control value S4, and supplies an analog power supply signal S1 obtained as a result of the digital/analog conversion to the power supply terminal P1 of the DUT 1 via the power supply line 4.

The power supply apparatus 100 is configured to be switchable between a normal mode and a calibration mode. When the DUT 1 is to be tested, the power supply apparatus 100 is set to the normal mode in which the power supply apparatus 100 supplies the power supply signal to the DUT 1.

Before the power supply apparatus 100 is operated in the normal mode, the power supply apparatus 100 is set to the calibration mode. In the calibration mode, the power supply apparatus 100 is configured to estimate the load characteristics such as the parasitic parameter 30, the control target 10, and so forth, and to set a control parameter S8 for the digital signal processing circuit 24 according to the load characteristics thus estimated.

The first selector 50 is arranged such that its output terminal is connected to the power supply line 4, the power supply signal S1 is received via its first input terminal (0) from the first D/A converter 26, and a test signal S7 is input to its second input terminal (1) from the load estimating unit 40.

The second selector 52 is arranged such that its input terminal is connected to the feedback line 6, its first output terminal (0) is connected to the input terminal of the first A/D converter 22, and its second output terminal (1) is connected to the input terminal of the second A/D converter 44.

In the normal mode, the first selector 50 and the second selector 52 are each connected to the first input terminal (0) side. In the calibration mode, they are each connected to the second input terminal (1) side.

In the calibration mode, the load estimating unit 40 is configured to estimate the load characteristics, and to generate the control parameter S8 that corresponds to the load characteristics thus estimated. The load estimating unit 40 applies, via the power supply line 4, the test signal S7 including a predetermined frequency component to a node N1 to which the power supply terminal P1 of the DUT 1 is to be connected. Subsequently, the load estimating unit 40 is configured to receive, via the feedback line 6, the observed signal S2 that occurs at the node N1 due to the application of the test signal S7, to generate the control parameter for the digital signal processing circuit 24 according to the test signal S7 and the observed signal S2', and to set the control parameter for the digital signal processing circuit 24.

Specifically, the load estimating unit 40 includes a signal generator 42, a second A/D converter 44, a third A/D converter 46, and a calculation unit 48.

The signal generator 42 is configured to generate a test signal S7 determined beforehand. The test signal S7 preferably contains a wide frequency component. For example, a pseudo-random binary signal satisfies this requirement, and can be generated in a simple manner. Thus, such a pseudo-random binary signal can preferably be employed as the test signal S7. Also, a pulse signal, a frequency sweep signal, or otherwise various kinds of similar signals can be employed instead of the pseudo-random binary signal.

The test signal S7 generated by the signal generator 42 is transmitted to the node N1 via the power supply line 4, and is input as the analog observed value S2' to the load estimating unit 40 via the feedback line 6. If a path formed of the power supply line 4, the feedback line 6, and the control target 10 has no loss and no frequency dependence, the analog observed value S2' will become equal to the test signal S7. However, with a realistic test apparatus 2, there will be a difference between the analog observed value S2' and the test signal S7 due to the effects of the parasitic parameter 30 and the impedance of the control target 10.

The second A/D converter 44 is configured to convert the analog observed value S2' into a digital observed value. The calculation unit 48 is configured to generate the control parameter S8 based upon the output value of the second A/D converter 44 and a digital value that corresponds to the test signal S7. The digital value that corresponds to the test signal S7 may be generated by converting the test signal S7 into a digital value by means of the third A/D converter 46. Also, such a digital value may be directly received from the signal generator 42.

The hardware resources of the load estimating unit 40 may be shared with other hardware resources as much as possible. For example, an arrangement may be made in which a single A/D converter is operated as the first A/D converter 22 in the normal mode, and is operated as the second A/D converter 44 in the calibration mode. Also, existing hardware resources provided in a conventional test apparatus may be shared as such hardware resources of the load estimating unit 40. For example, the signal generator 42 or the like may be configured using a pattern generator included in the test apparatus.

The calculation unit 48 is configured to calculate, based upon the test signal S7 and the observed signal S2', a transfer function G(z) for a path including the power supply line 4 and the feedback line 6, and to generate the control parameter S8 according to the transfer function G(z). The transfer function G(z) can be calculated using known techniques, examples of which include a least-squares estimation method using an ARX (Auto-Regressive eXogenous) model. It should be noted that this method is just one of a large number of methods. Other methods such as a Fourier transform method, an amplitude/phase plotting method, etc., may be employed. That is to say, the calculation method for the transfer function G(z) is not restricted in particular.

Furthermore, various methods have been proposed as a method for determining an optimum control parameter based upon the transfer function G(z). For example, in the PID control system, the CHR (Chein, Hrones, Reswick) method, which is a step response method, can be employed. Alternatively, the ultimate sensitivity method or otherwise the ZN (Ziegler Nichols) step response method can be employed.

The above is the configuration of the power supply apparatus 100. Next, description will be made regarding the operation thereof.

First, the power supply apparatus 100 is set to the calibration mode. Subsequently, the load estimating unit 40 generates the test signal S7, and measures the analog observed value S2' that corresponds to the test signal S7, so as to estimate the frequency characteristics of the path including the power supply line 4 and the feedback line 6, i.e., the transfer function G(z).

Figure 3A:
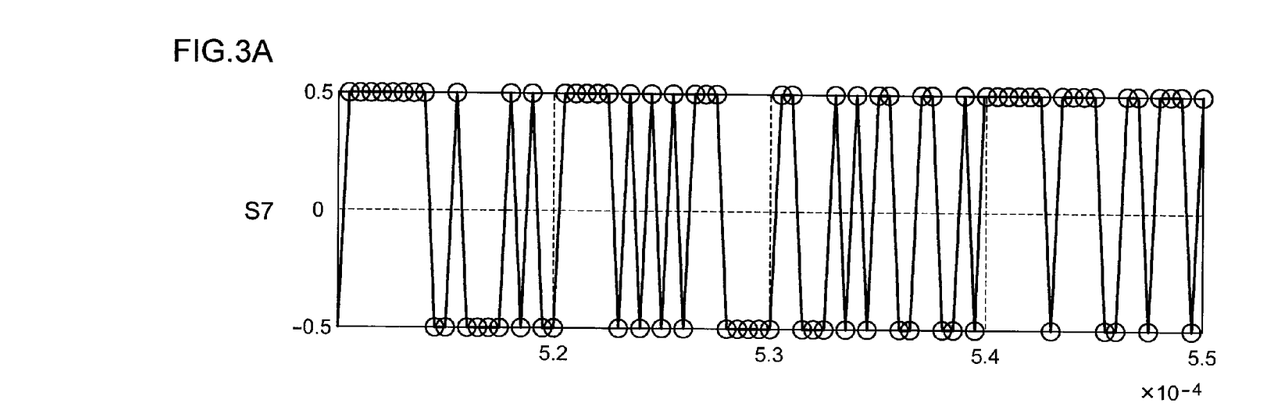
FIG. 3A is a waveform simulation diagram showing a time discrete PRBS signal.
Figure 3B:
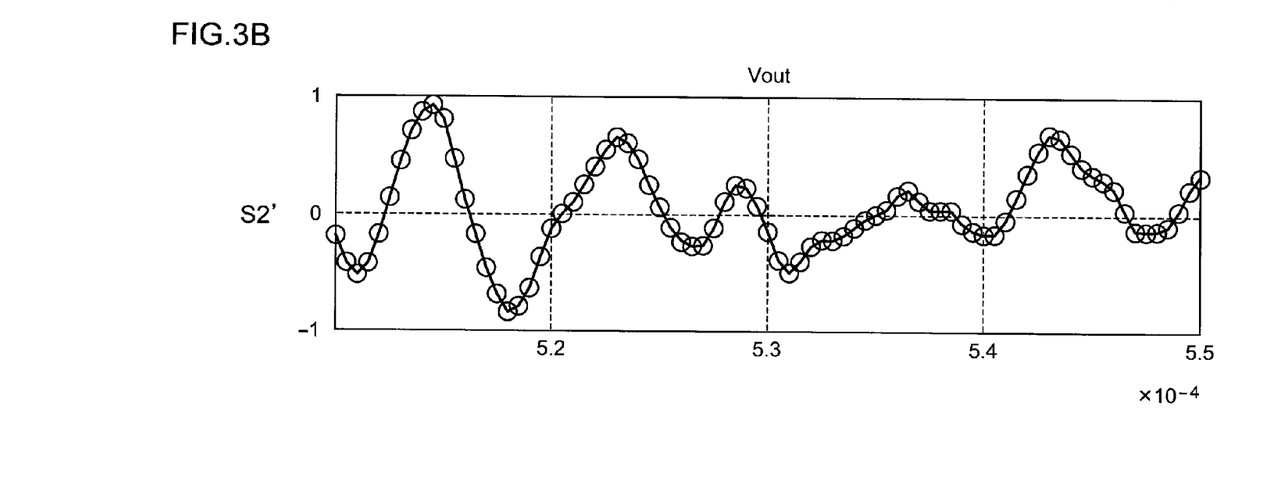
FIG. 3B is a waveform simulation diagram showing an observed value when the PRBS signal is supplied to a parasitic parameter configured as an LCR filter shown in FIG. 2.

FIGS. 3A and 3B are waveform simulation diagrams which respectively show a time discrete PRBS signal and the observed value S2' obtained by supplying the discrete time PRBS signal thus generated to the parasitic parameter 30 configured as an LCR filter shown in FIG. 2. This simulation is made assuming that L=200 nH, C=6 µF, and R=0.1 Ω.

The time discrete transfer function G(z) for an LCR circuit can be represented by the following Expression (1) using five parameters $a_1$ and $a_2$ and $b_0$ through $b_2$.

$$G(z) = (b_0 + b_1 z^{-1} + b_2 z^{-2}) / (1 + a_1 z^{-1} + a_2 z^{-2}) \quad (1)$$

The respective parameters $a_1$ and $a_2$, and $b_0$ through $b_2$, are calculated by means of the least-squares estimation method using an ARX model based upon 1000 input/output data points and the corresponding 1000 output data points, thereby obtaining the following parameters.

$a_1 = -1.59764803889388801$
$a_2 = 0.778804285207282$
$b_0 = 0.000000003744685$
$b_1 = 0.094373091781548$
$b_2 = 0.086783120071316$

On the other hand, the time continuous transfer function $G_{LCR}(s)$ is represented by the following Expression (2).

$$G_{LCR}(s) = (1/LC) / \{s^2 + R/L \cdot s + 1/(LC)\} \quad (2)$$

In a case in which L=200 nH, C=6 µF, and R=0.1 Ω, by discretizing the transfer function $G_{LCR}(s)$ represented by Expression (2) with a symbol rate of 2 Msps, the respective parameters are obtained as follows.

$a_1 = -1.598$
$a_2 = 0.7788$
$b_0 = 0$
$b_1 = 0.09438$
$b_2 = 0.08678$

It can be understood that the parameters estimated based upon the test signal S7 and the analog observed value S2' match the time continuous transfer function $G_{LCR}(s)$ with high precision.

The load estimating unit 40 is configured to optimize the control parameter S8 for the digital signal processing circuit 24 based upon the transfer function G(z) thus estimated. That is to say, the control parameter S8 is optimized taking into account the actual impedances of the parasitic parameter 30 and the control target 10.

Next, the mode is switched to the normal mode. In the normal mode, feedback control is performed such that the power supply signal S2 (Vdd) matches the reference value Ref using the control parameter S8 thus optimized in the calibration mode. Such an arrangement is capable of providing the power supply signal S2 that develops at the power supply terminal P1 in a better stabilized condition than in conventional arrangements. Thus, such an arrangement allows the DUT 1 to be tested in circumstances in which there is sufficiently small fluctuation in the power supply.

The above is the operation of the power supply apparatus 100.

The parasitic parameter 30 and the control target 10 vary greatly depending on the circumstances in which the test apparatus 2 is used. With conventional techniques, the designer of the power supply apparatus 100 assumes the control target 10 and estimates the impedance of the control target 10, and determines the control characteristics of the power supply apparatus based upon the impedance thus estimated. Accordingly, if a parasitic parameter 30 or a control target 10 that differs from what was assumed beforehand is connected in actuality, this leads to a problem of degraded performance of the power supply apparatus 100. Such degraded performance results in increased ringing and increased settling time.

In contrast, with the power supply apparatus 100 according to the embodiment, the power supply signal S2 is generated using the control parameter S8 optimized with respect to the parasitic parameter 30 and the impedance of the control target 10 for each test apparatus 2. Thus, such an arrangement provides the power supply signal S2 in a better stabilized condition than in conventional arrangements.

Existing hardware resources of the test apparatus 2 can be shared as the components of the load estimating unit 40. Thus, such a load estimating unit 40 has a relatively small impact on the cost of the test apparatus 2, which is another advantage.

Description has been made regarding the present invention with reference to the embodiments. The above-described embodiments have been described for exemplary purposes only, and are by no means intended to be interpreted restrictively. Rather, various modifications may be made by making various combinations of the aforementioned components or processes. Description will be made below regarding such modifications.

Figure 4:
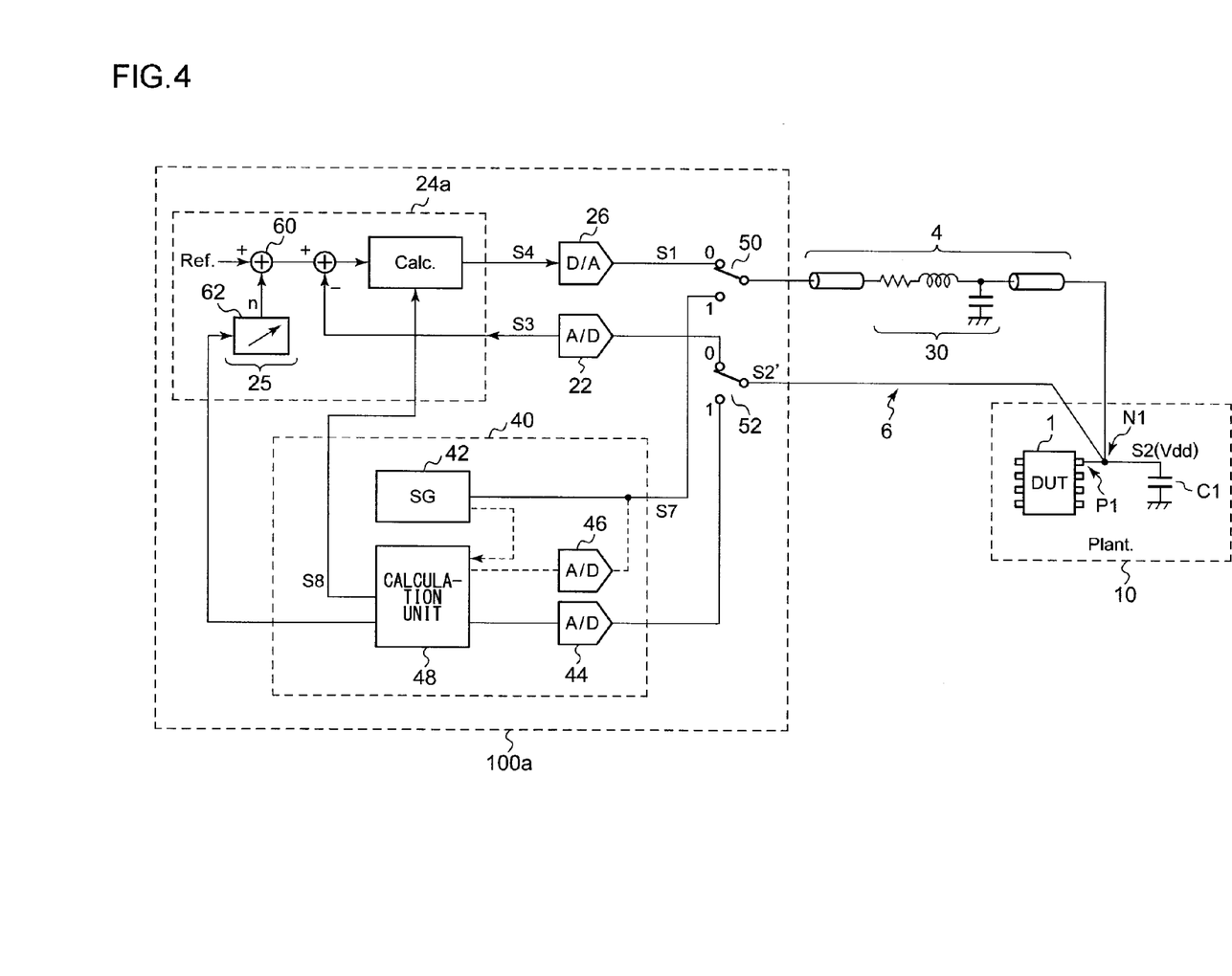
FIG. 4 is a block diagram which shows a power supply apparatus according to a modification.

FIG. 4 is a block diagram which shows a power supply apparatus 100a according to a modification. Typical power supply apparatuses are required to stabilize the power supply signal S2 supplied to the power supply terminal P1 of the DUT 1 to a constant target value. In addition, a power supply apparatus 100a shown in FIG. 4 has a function of superimposing a desired waveform $n_y$ such as a random noise waveform, a sine waveform, a pulse waveform, etc., on the power supply signal S2.

In FIG. 4, a digital signal processing circuit 24a further includes a signal superimposing unit 25 in addition to the configuration of the digital signal processing circuit 24 shown in FIG. 2. The signal superimposing unit 25 is configured to superimpose on the reference value Ref a signal n that corresponds to the transfer function G(z) acquired by the load estimating unit 40. The signal superimposing unit 25 includes a signal generator 62 configured to generate the signal n that corresponds to the transfer function G(z), and an adder 60 configured to add the signal n and the reference value Ref.

Figure 5A:
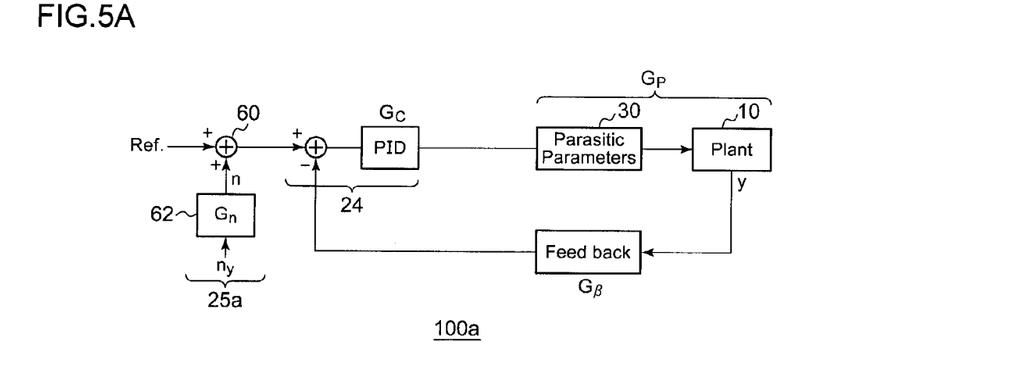
FIG. 5A is a block diagram showing the power supply apparatus shown in FIG. 4, and FIGS. 5B and 5C are block diagrams each showing a power supply apparatus according to a modification.

FIG. 5A is a block diagram which shows the power supply apparatus 100a shown in FIG. 4. The symbol "y" represents the power supply signal S2 that develops at the power supply terminal P1, "$G_c$" represents the transfer function for the digital signal processing circuit 24 shown in FIG. 2, "$G_{\square}$" represents the transfer function for a feedback path including the feedback line 6, the first A/D converter 22, and so forth, and "$G_p$" represents the transfer function for a path including the parasitic parameter 30 and the control target 10.

In FIG. 5A, the following Expression (3) holds true.

$$y = \text{Ref} \cdot G_c \cdot G_p / (1 + G_{\square} \cdot G_c \cdot G_p) + n_y \cdot G_n \cdot G_c \cdot G_p / (1 + G_{\square} \cdot G_c \cdot G_p) \quad (3)$$

Thus, when the following Expression (4) is satisfied, the following Expression (5) holds true.

$$G_n = G_{\square} + (G_c \cdot G_p)^{-1} \quad (4)$$

$$y = \text{Ref} \cdot G_c \cdot G_p / (1 + G_{\square} \cdot G_c \cdot G_p) + n_y \quad (5)$$

That is to say, by superimposing, on the reference value Ref, the signal $n = n_y \cdot G_n$ obtained by applying the transfer function $G_n$ represented by Expression (4) to the signal $n_y$ to be superimposed on the control amount y, such an arrangement is capable of generating the signal $n_y$ without change, superimposed on the control amount y.

With such an arrangement, the transfer functions $G_c$, $G_p$, and $G_{\square}$ can be obtained as the design values, or otherwise as the estimated values estimated by the load estimating unit 40, or otherwise can be calculated using a combination of the design values and the estimated values. Thus, the transfer function $G_n$ represented by the Expression (4) can be calculated. For example, an approximated relation $G_{\square} = G_p$ may be used. Alternatively, as it is known from experience that the parasitic parameters of the feedback line do not have a large effect on the control characteristics, a value calculated based upon the design parameters may be employed as the transfer function $G_{\square}$. The signal generator 62 shown in FIG. 5A or FIG. 4 may preferably be configured to generate the signal n by applying the transfer function $G_n$ that satisfies the relational expression (4) to the signal $n_y$ to be superimposed on the power supply signal S2.

As described above, by generating the signal n using the transfer function G(z) estimated by the load estimating unit 40, such an arrangement is capable of generating such a desired signal component $n_y$ superimposed on the power supply signal S2.

Figure 5B:
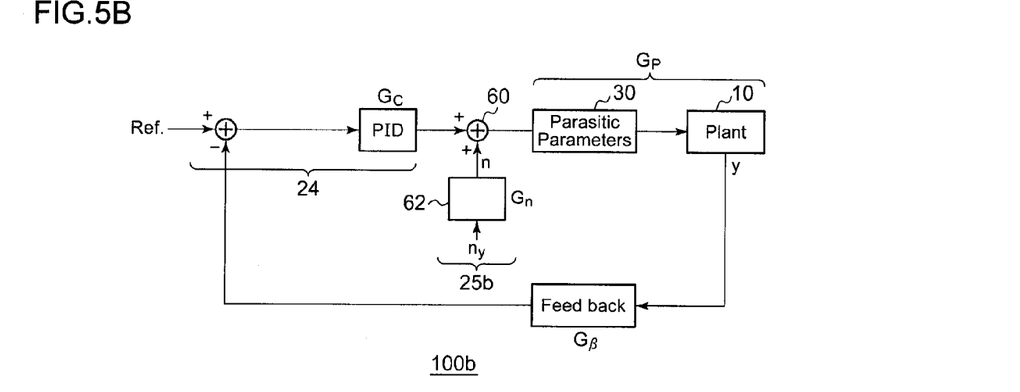

FIG. 5B is a block diagram which shows a power supply apparatus 100b according to a modification. The power supply apparatus 100b shown in FIG. 5B has a configuration in which a signal superimposing unit 25b is arranged within the feedback group, which is a point of difference from the power supply apparatus shown in FIG. 4 or 5A. That is to say, with such a modification, the signal superimposing unit 25b is arranged downstream of the controller 24. With such an arrangement, the signal $n = G_n(z) \cdot n_y$ that corresponds to the transfer function $G_n(z)$ acquired by the load estimating unit 40 is superimposed on the output value (control value S4) of the digital signal processing circuit 24.

With the power supply apparatus 100b shown in FIG. 5B, the following Expression (6) holds true.

$$y = \text{Ref} \cdot G_c \cdot G_p / (1 + G_{\square} \cdot G_c \cdot G_p) + n_y \cdot G_n \cdot G_p / (1 + G_{\square} \cdot G_c \cdot G_p) \quad (6)$$

Thus, when the following Expression (7) is satisfied, the aforementioned Expression (5) holds true.

$$G_n = G_p^{-1} + G_{\square} \cdot G_c \quad (7)$$

Thus, such an arrangement is capable of generating the signal $n_y$ without change, superimposed on the control amount y.

Figure 5C:
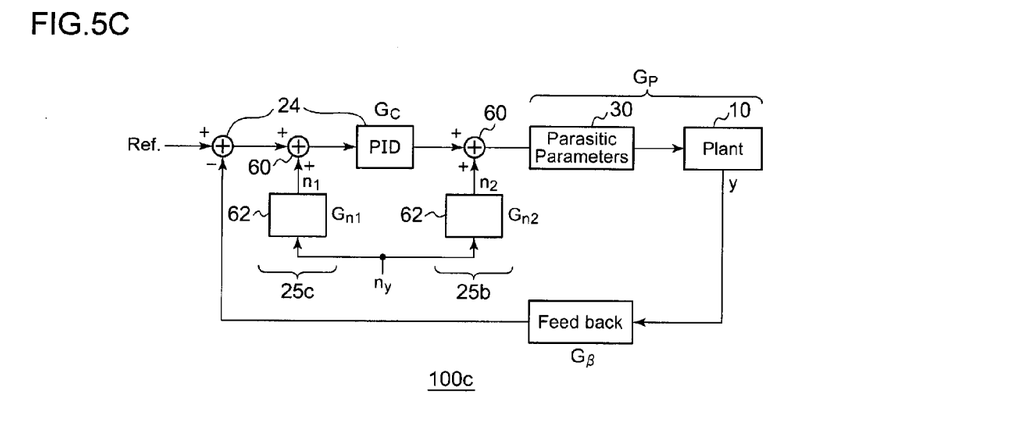

FIG. 5C is a block diagram which shows a power supply apparatus 100c according to another modification. The power supply apparatus 100c shown in FIG. 5C includes a signal superimposing unit 25c in addition to the configuration of the power supply apparatus 100b shown in FIG. 5B. The signal superimposing unit 25c is configured to superimpose a signal $n_1 = G_{n1}(z) \cdot n_y$ that corresponds to the transfer function $G_{n1}(z)$ acquired by the load estimating unit 40 on the difference value ($G_{\square} \cdot y - \text{Ref}$) between the digital observed value $G_{\square} \cdot y$ and the reference value Ref. The signal superimposing unit 25b is configured to superimpose a signal $n_2 = G_{n2}(z) \cdot n_y$ that corresponds to the transfer function $G_{n2}(z)$ acquired by the load estimating unit 40 on the output value (control value S4) of the digital signal processing circuit 24.

With the power supply apparatus 100c shown in FIG. 5C, the following Expression (8) holds true.

$$y = \text{Ref} \cdot G_c \cdot G_p / (1 + G_\square \cdot G_c \cdot G_p) + n_y \cdot (G_{n2} \cdot G_p + G_{n1} \cdot G_c \cdot G_p) / (1 + G_\square \cdot G_c \cdot G_p) \quad (8)$$

In FIG. 5C, when the relations $G_{n1} = G_\square$, and $G_{n2} = G_p^{-1}$ are satisfied, the aforementioned relational Expression (5) holds true, thereby generating the signal $n_y$ without change, superimposed on the control amount y.

Also, a modification which can be effectively employed may be made by omitting the signal superimposing unit 25b from such a configuration shown in FIG. 5C. With such a modification, the following Expression (9), which is obtained by substituting $G_{n2} = 0$ into Expression (8), holds true.

$$y = \text{Ref} \cdot G_c \cdot G_p / (1 + G_\square \cdot G_c \cdot G_p) + n_y \cdot (G_{n1} \cdot G_c \cdot G_p) / (1 + G_\square \cdot G_c \cdot G_p) \quad (9)$$

Thus, when the following Expression (10) is satisfied, the aforementioned Expression (5) holds true, thereby generating the signal $n_y$ without change, superimposed on the control amount y.

$$G_{n1} = (1 + G_\square \cdot G_c \cdot G_p) / (G_c \cdot G_p) \quad (10)$$

Description has been made in the embodiment regarding an arrangement in which the mode is switched between the normal mode and the calibration mode. However, the present invention is not restricted to such an arrangement. For example, an arrangement may be made in which the load is estimated by operating the load estimating unit 40 in the normal mode in a state in which the DUT 1 is actually operating (online), and the control parameter for the digital signal processing circuit 24 is set based upon the load thus estimated. In this case, a circuit configured to combine the control value S1 and the test signal S7 may be arranged instead of the selector 50. Also, a distributer configured to distribute a signal to two paths may be arranged instead of the second selector 52.

Description has been made in the embodiment regarding an arrangement in which the power supply apparatus 100 is configured mainly in the form of a digital circuit. Also, the entire configuration of the power supply apparatus 100 may be configured in the form of an analog circuit. In this case, an analog power supply unit is arranged instead of the power supply unit that is composed of the digital signal processing circuit 24, the first D/A converter 26, and the first A/D converter 22 shown in FIG. 2. The power supply unit is configured to receive, via the feedback line 6, the observed value S2' that corresponds to the power supply signal S2 supplied to the power supply terminal P1 of the DUT 1, and to generate the power supply signal S1 that is adjusted such that the observed value S2' matches the predetermined reference value Ref. With such an arrangement, the load estimating unit 40 is configured to generate the test signal S7 containing a predetermined frequency component, to apply the test signal S7 via the power supply line 4 to the node N1 to which the power supply terminal P1 of the DUT 1 is to be connected, to receive, via the feedback line 6, the observed signal S2' that occurs at the node N1 due to the application of the test signal S7, and to set the signal processing operation of the power supply unit according to the test signal S7 and the observed signal S2'.

While the preferred embodiments of the present invention have been described using specific terms, such description is for illustrative purposes only, and it is to be understood that changes and variations may be made without departing from the spirit or scope of the appended claims.

What is claimed is:

1. A power supply apparatus for a test apparatus, configured to supply a power supply signal to a power supply terminal of a device under test via a power supply line, wherein the power supply apparatus is selectable between a normal mode and a calibration mode, the power supply apparatus comprising:
    a first A/D converter configured to receive, via a feedback line, an analog observed value that corresponds to the power supply signal supplied to the power supply terminal of the device under test, and to perform analog/digital conversion of the analog observed value thus received so as to generate a digital observed value in the normal mode;
    a digital signal processing circuit configured to generate, by means of digital calculation processing, a control value that is adjusted such that the digital observed value received from the first A/D converter matches a predetermined reference value in the normal mode;
    a D/A converter configured to perform digital/analog conversion of the control value so as to generate an analog power supply signal and to supply the analog power supply signal to the power supply terminal of the device under test via the power supply line in the normal mode; and
    a load estimating unit configured to apply a test signal containing a predetermined frequency component via the power supply line to a node to which the power supply terminal of the device under test is to be connected, to receive, via the feedback line, an observed signal that occurs at the node due to the application of the test signal, and to generate a control parameter according to the test signal and the observed signal in the calibration mode, wherein the digital signal processing circuit generates the control value by using the control parameter in the normal mode.

2. A power supply apparatus according to claim 1, further comprising a first selector arranged such that its output terminal is connected to the power supply line, the power supply signal is received via its first input terminal from the D/A converter, and the test signal is input via its second input terminal.

3. A power supply apparatus according to claim 2, wherein the load estimating unit comprises:
    a signal generator configured to generate the test signal;
    a second A/D converter configured to convert the observed signal into a digital observed value; and
    a calculation unit configured to generate the control parameter based upon an output value of the second A/D converter and a digital value that corresponds to the test signal.

4. A power supply apparatus according to claim 3, further comprising a second selector arranged such that its input terminal is connected to the feedback line, its first output terminal is connected to an input terminal of the first A/D converter, and its second output terminal is connected to an input terminal of the second A/D converter.

5. A power supply apparatus according to claim 2, wherein the load estimating unit is configured to calculate a transfer function for a path comprising the power supply line and the feedback line based upon the test signal and the observed signal, and to generate the control parameter according to the transfer function.

6. A power supply apparatus according to claim 5, further comprising a signal superimposing unit configured to superimpose on the reference value a signal that corresponds to the transfer function acquired by the load estimating unit.

7. A power supply apparatus according to claim 5, further comprising a signal superimposing unit configured to superimpose a signal that corresponds to the transfer function acquired by the load estimating unit on a value of the difference between the digital observed value and the reference value.

8. A power supply apparatus according to claim 5, further comprising a signal superimposing unit configured to superimpose on the control value a signal that corresponds to the transfer function acquired by the load estimating unit.

9. A test apparatus according to claim 2, wherein the test signal is configured as any one of a pseudo-random binary signal, a pulse signal, and a frequency sweep signal.

10. A power supply apparatus according to claim 1, wherein the load estimating unit comprises:
    a signal generator configured to generate the test signal;
    a second A/D converter configured to convert the observed signal into a digital observed value; and
    a calculation unit configured to generate the control parameter based upon an output value of the second A/D converter and a digital value that corresponds to the test signal.

11. A power supply apparatus according to claim 10, further comprising a second selector arranged such that its input terminal is connected to the feedback line, its first output terminal is connected to an input terminal of the first A/D converter, and its second output terminal is connected to an input terminal of the second A/D converter.

12. A power supply apparatus according to claim 1, wherein the load estimating unit is configured to calculate a transfer function for a path comprising the power supply line and the feedback line based upon the test signal and the observed signal, and to generate the control parameter according to the transfer function.

13. A power supply apparatus according to claim 12, further comprising a signal superimposing unit configured to superimpose on the reference value a signal that corresponds to the transfer function acquired by the load estimating unit.

14. A power supply apparatus according to claim 12, further comprising a signal superimposing unit configured to superimpose a signal that corresponds to the transfer function acquired by the load estimating unit on a value of the difference between the digital observed value and the reference value.

15. A power supply apparatus according to claim 12, further comprising a signal superimposing unit configured to superimpose on the control value a signal that corresponds to the transfer function acquired by the load estimating unit.

16. A test apparatus according to claim 1, wherein the test signal is configured as any one of a pseudo-random binary signal, a pulse signal, and a frequency sweep signal.

17. A test apparatus comprising a power supply apparatus according to claim 1, configured to supply electric power to a device under test.

18. A power supply apparatus for a test apparatus, configured to supply a power supply signal to a power supply terminal of a device under test via a power supply line, wherein the power supply apparatus is selectable between a normal mode and a calibration mode, the power supply apparatus comprising:
    a power supply unit configured to receive, via a feedback line, an observed value that corresponds to the power supply signal supplied to the power supply terminal of the device under test, and to generate a power supply signal that is adjusted such that the observed value matches a predetermined reference value in the normal mode; and
    a load estimating unit configured to generate a test signal containing a predetermined frequency component, to apply the test signal via a power supply line to a node via which a power supply terminal of the device under test is to be connected, to receive, via the feedback line, an observed signal that occurs at the node due to the application of the test signal, and to set a signal processing operation of the power supply unit according to the test signal and the observed signal in the calibration mode, wherein, in the normal mode, the power supply unit performs the signal processing operation set by the load estimating unit.

19. A test apparatus comprising a power supply apparatus according to claim 18, configured to supply electric power to a device under test.

* * * * *